United States Patent
Tsai et al.

(10) Patent No.: US 7,399,189 B2
(45) Date of Patent: Jul. 15, 2008

(54) ELECTRICAL CONNECTOR

(75) Inventors: Chou Hsuan Tsai, Hsin-Chuang (TW); Shien Wen Chang, Hsin-Chuang (TW); Shin Hao Chien, Hsin-Chuang (TW)

(73) Assignee: Top Yang Technology Enterprise Co., Ltd., Taipei Hsien (TW)

( * ) Notice: Subject to any disclaimer, the term of this patent is extended or adjusted under 35 U.S.C. 154(b) by 0 days.

(21) Appl. No.: 11/900,798

(22) Filed: Sep. 13, 2007

(65) Prior Publication Data
US 2008/0070431 A1 Mar. 20, 2008

(51) Int. Cl.
*H01R 13/62* (2006.01)
(52) U.S. Cl. ............... 439/159; 439/71; 439/331
(58) Field of Classification Search ............ 439/71, 439/72, 159–160, 259–268, 330, 331
See application file for complete search history.

(56) References Cited

U.S. PATENT DOCUMENTS

| | | | | |
|---|---|---|---|---|
| 7,270,549 B2 * | 9/2007 | Ju et al. | ............ | 439/66 |
| 2003/0224651 A1 * | 12/2003 | Chang | ............ | 439/483 |
| 2007/0254508 A1 * | 11/2007 | Crippa et al. | ............ | 439/160 |

* cited by examiner

*Primary Examiner*—James Harvey
(74) *Attorney, Agent, or Firm*—Pro-Techtor Int'l Services

(57) ABSTRACT

An electrical connector includes a base, an upper cover, terminals and a lever. The base is formed with terminal slots and a supporting seat formed with pivoting portions. The upper cover has a main body formed with through holes for accommodating the terminals, and a rear plate connected to a rear end of the main body. The lever has a rocking portion and a pivoting shaft, which includes first shafts pivotally connected to the pivoting portions, and a second shaft engaged with the rear plate. A side edge of the rear plate is nearer to a middle of the upper cover than a side edge of the main body. The rocking portion is disposed between the side edges so that the rocking portion may be rotated with respect to the side edge of the rear plate without exceeding the side edge of the main body.

8 Claims, 9 Drawing Sheets

ELECTRICAL CONNECTOR

BACKGROUND OF THE INVENTION

1. Field of Invention

The invention relates to an electrical connector, and more particularly to a CPU connector that may be operated without interference.

2. Related Art

Referring to FIGS. 1 and 2, a central processing unit (CPU) connector includes a base 10, terminals 15, an upper cover 20 and a lever 16. The base 10 is formed with several terminal slots 11 arranged in an array, and a supporting seat 12 disposed behind the terminal slots 11. Two sides of the middle of the supporting seat 12 are formed with pivoting slots 13. Two locking blocks 14 are disposed on two sides of the region in which the terminal slots are formed. The terminals 15 are disposed in the terminal slots 11 of the base 10, respectively. The upper cover 20 covers the base 10 and is engaged with the base 10. The upper cover 20 has two lateral sides 21 and front and rear ends 22 and 23 and forms an inverse-U shape. Two side edges of the upper cover 20 are formed with slots 24 to be engaged with the locking blocks 14 of the base 10. A slot 25 is formed on an inner surface near the rear end of the upper cover 20. The upper cover 20 is formed with through holes 26 corresponding to the terminal slots 11 of the base 10. The lever 16 has a first rod 17 and a second rod 18 perpendicular to the first rod 17. The middle section of the second rod 18 is formed with an eccentric convex rod 19. The second rod 18 is pivotally connected to the pivoting slot 13 at the rear end of the base 10. The convex rod 19 engages with the slot 25 at the rear end of the inner surface of the upper cover 20. When the first rod 17 rocks toward the front end of the base 10, the convex rod 19 can move the upper cover 20 forward.

In use, as shown in FIG. 3, when the first rod 17 of the lever 16 is in the longitudinal state, pins 28 of a CPU 27 may be inserted into the through holes 26 of the upper cover 20 without interference. As shown in FIG. 2, when the first rod 17 of the lever 16 rocks to the horizontal state toward the front end of the base 10, the upper cover 20 may be moved forward by a stroke so that the pins of the CPU may be moved and thus be electrically connected to the terminals.

As shown in FIG. 2, the first rod 17 of the lever 16 is disposed on one side of the base 10 in the used state. Thus, the overall width is increased, and the CPU connector is only suitable for a desktop computer but not for a notebook computer with the narrower space.

As shown in FIGS. 4 and 5, the CPU connector applied to the notebook computer includes the base 10, the upper cover 20 and a cam structure 30. Similarly, the upper cover 20 covers the base 10, is engaged with the base 10, and may slide relative to the base 10. The cam structure 30 is pivotally connected to a rear end of the base 10, and can move the upper cover 20 back and forth according to the cam function. A top end of the cam structure 30 is formed with an engaging recess 31. As shown in FIG. 4, when a screw driver rotates the cam structure 30 to make the engaging recess 31 extend laterally, the upper cover 20 is moved backward so that the insertion may be performed without interference. As shown in FIG. 5, when the screw driver rotates the cam structure 30 to make the engaging recess 31 extend longitudinally, the upper cover 20 is moved forward to lock the inserted CPU.

The CPU connector applied to the notebook computer adopts the cam structure 30, which does not occupy too much space, and omits the level disposed on one side. Although the space is saved, the operation is inconvenient. That is, the tool has to be used to rotate the cam structure 30 in a more laboriously manner.

SUMMARY OF THE INVENTION

It is therefore an object of the invention to provide a CPU connector capable of saving the space and facilitating the operation.

The invention achieves the above-identified object by providing a central processing unit (CPU) connector. The connector includes a base, an upper cover, terminals and a lever. The base is formed with terminal slots arranged in an array, and a supporting seat, which is disposed behind the terminal slots and formed with pivoting portions. The upper cover covers and is engaged with the base and may slide back and forth relative to the base. The upper cover has a main body and a rear plate. The main body is formed with through holes, which are arranged in an array and correspond to the terminal slots of the base, and the rear plate is connected to a rear end of the main body. The terminals are disposed in the terminal slots of the base. The lever has a rocking portion and a pivoting shaft. The pivoting shaft includes first shafts and a second shaft. The first shafts are eccentric with respect to the second shaft. The first shafts are pivotally connected to the pivoting portions of the base. The second shaft is engaged with an inner surface of the rear plate of the upper cover, the rocking portion is connected to the first shaft with an angle formed between the rocking portion and the first shaft, and the upper cover is moved back and forth when the rocking portion is rocked so that the pivoting shaft is rotated. A side edge of the rear plate of the upper cover is nearer to a middle of the upper cover than a side edge of the main body. The rocking portion of the lever is disposed between the side edge of the rear plate of the upper cover and the side edge of the main body of the upper cover so that the rocking portion of the lever may be rotated with respect to the side edge of the rear plate without exceeding the side edge of the main body.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

The present invention will be apparent from the following detailed description, which proceeds with reference to the accompanying drawings, wherein the same references relate to the same elements.

Figure 1:
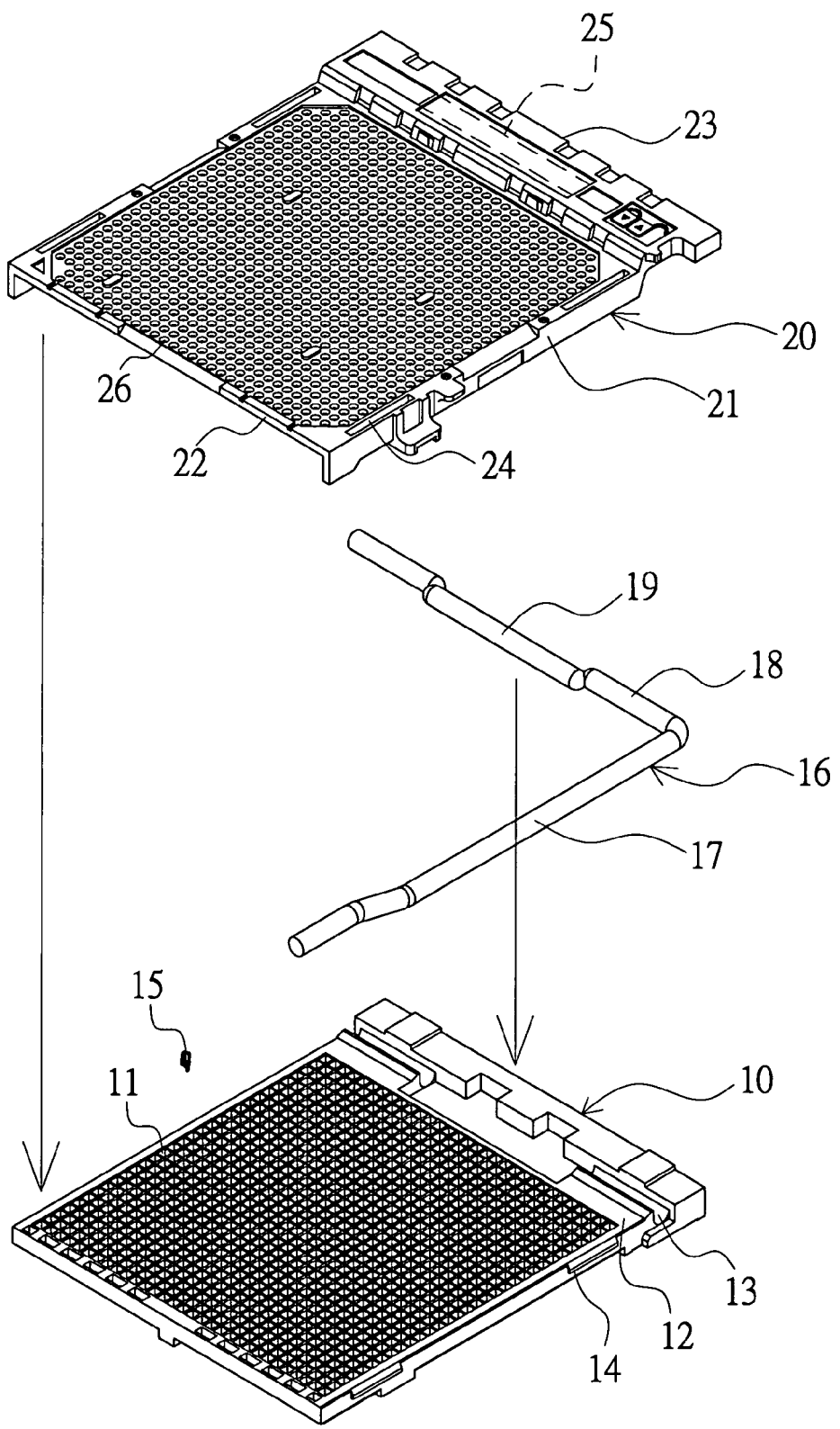
FIG. 1 is a pictorially exploded view showing a conventional CPU connector.
Figure 2:
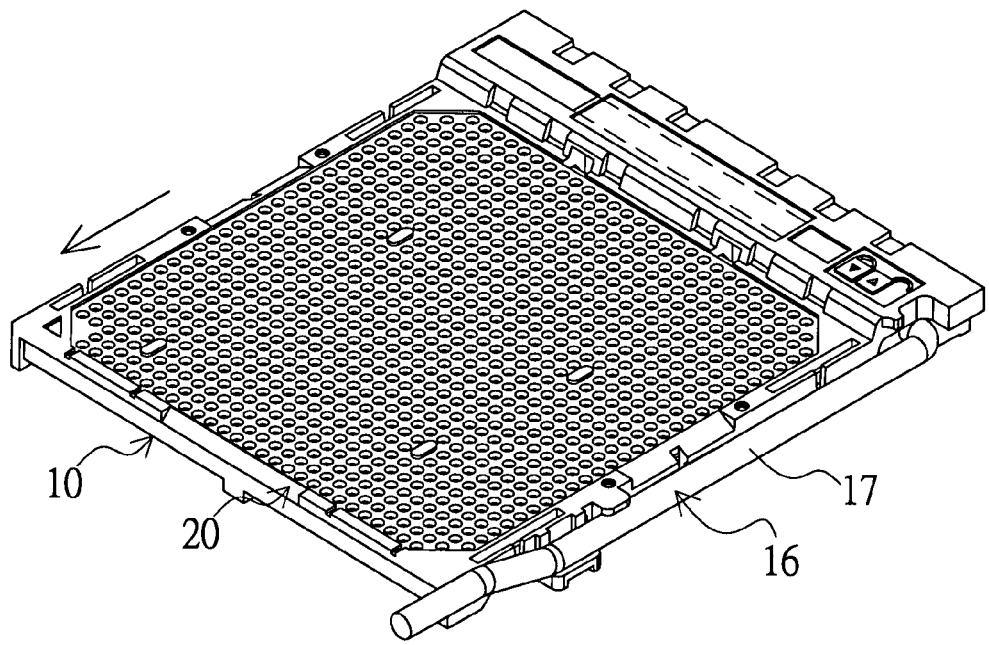
FIG. 2 is a pictorially assembled view showing the conventional CPU connector.
Figure 3:
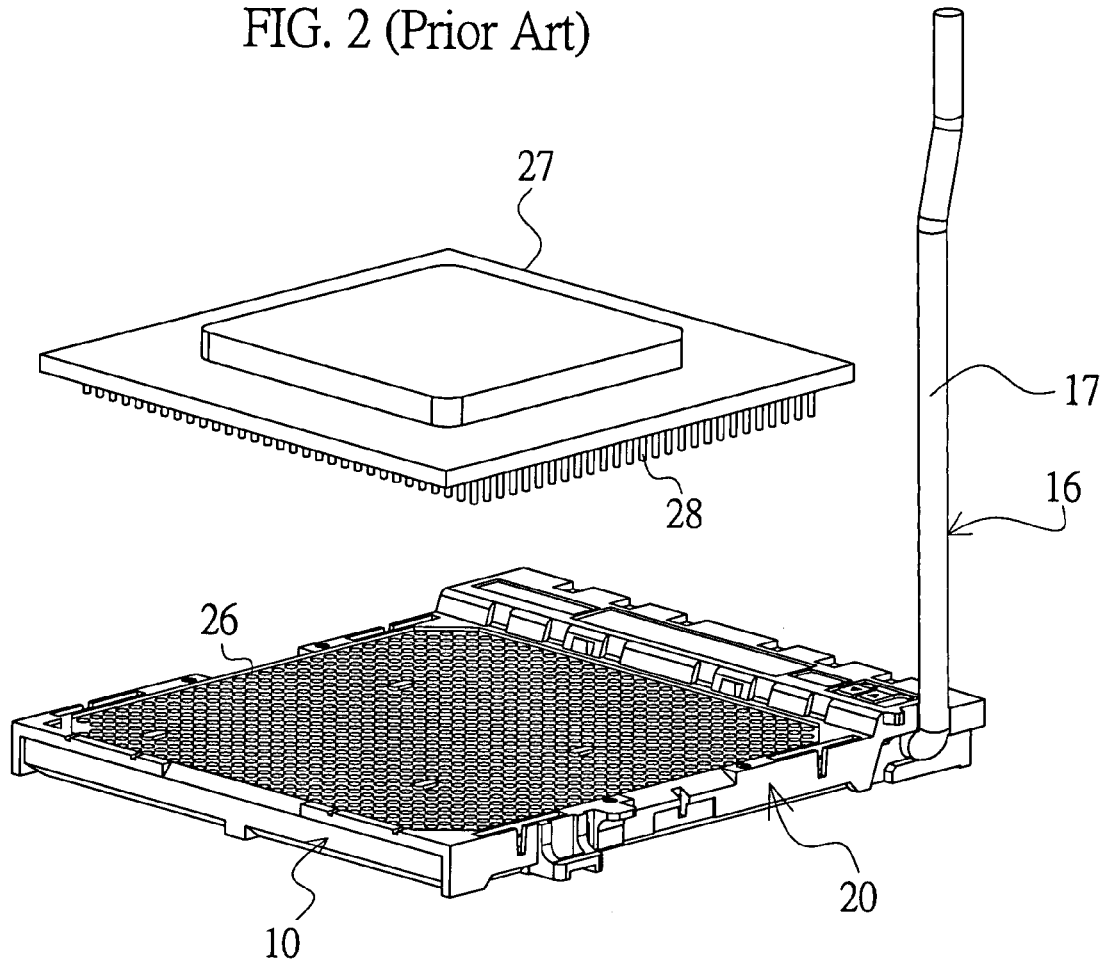
FIG. 3 is a pictorial view showing a used state of the conventional CPU connector.
Figure 4:
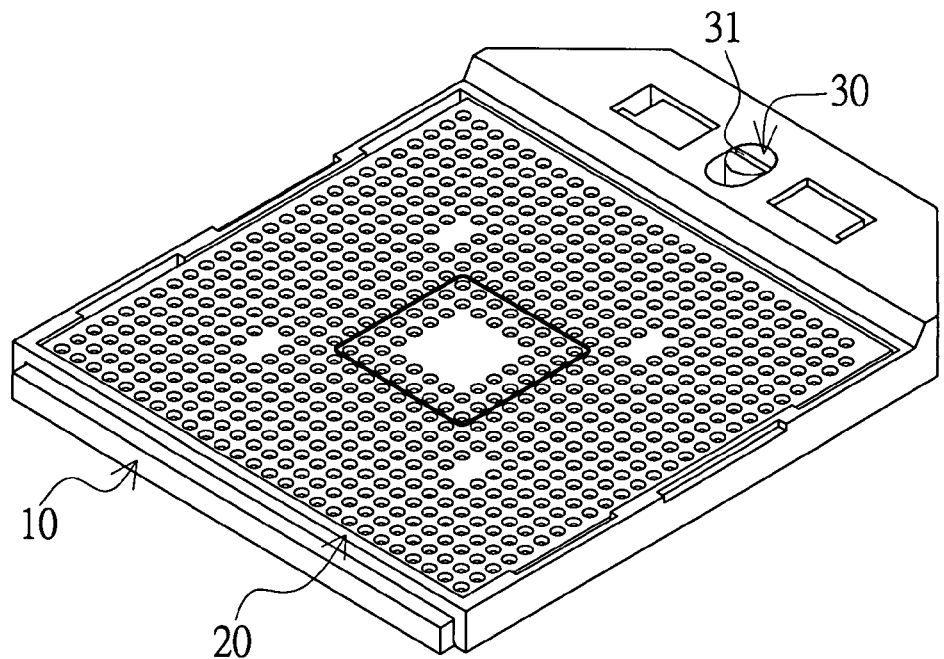
FIG. 4 is a pictorially assembled view showing the conventional CPU connector.
Figure 5:
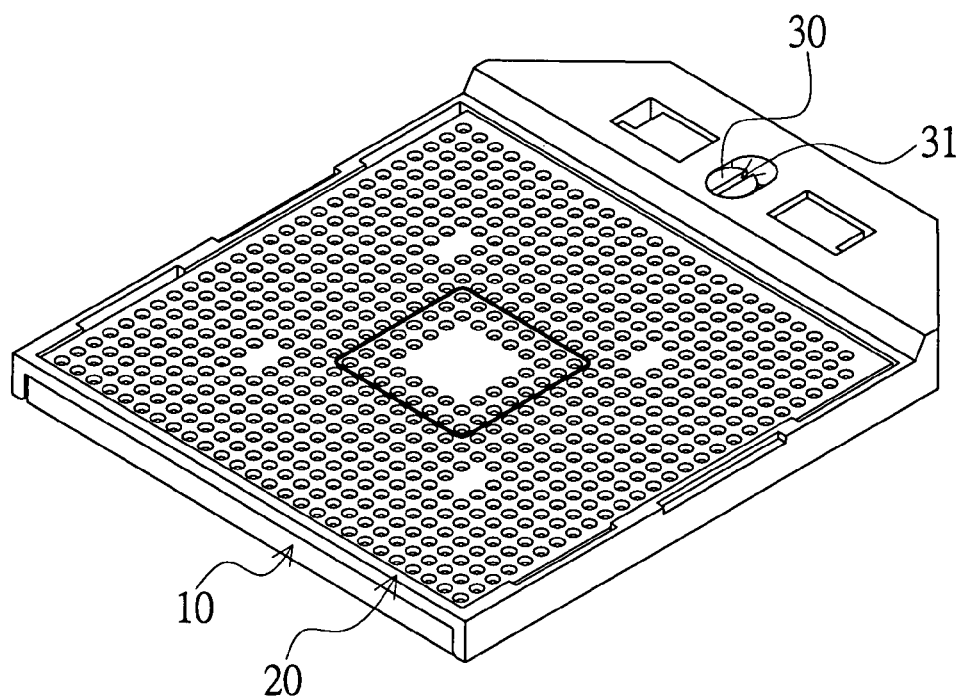
FIG. 5 is a pictorial view showing the used state of the conventional CPU connector.
Figure 6:
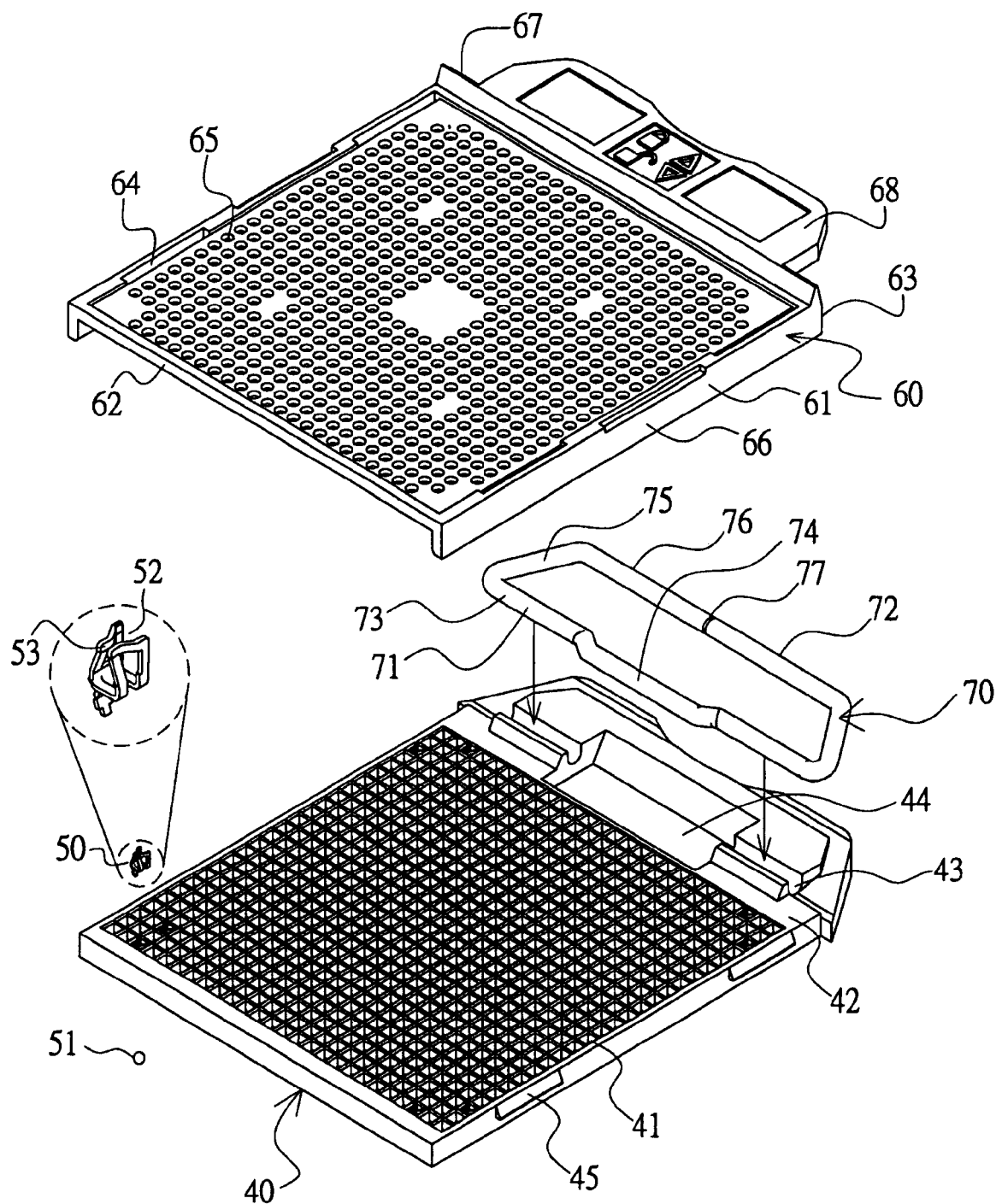
FIG. 6 is a pictorially exploded view showing an electrical connector according to a first embodiment of the invention.
Figure 7:
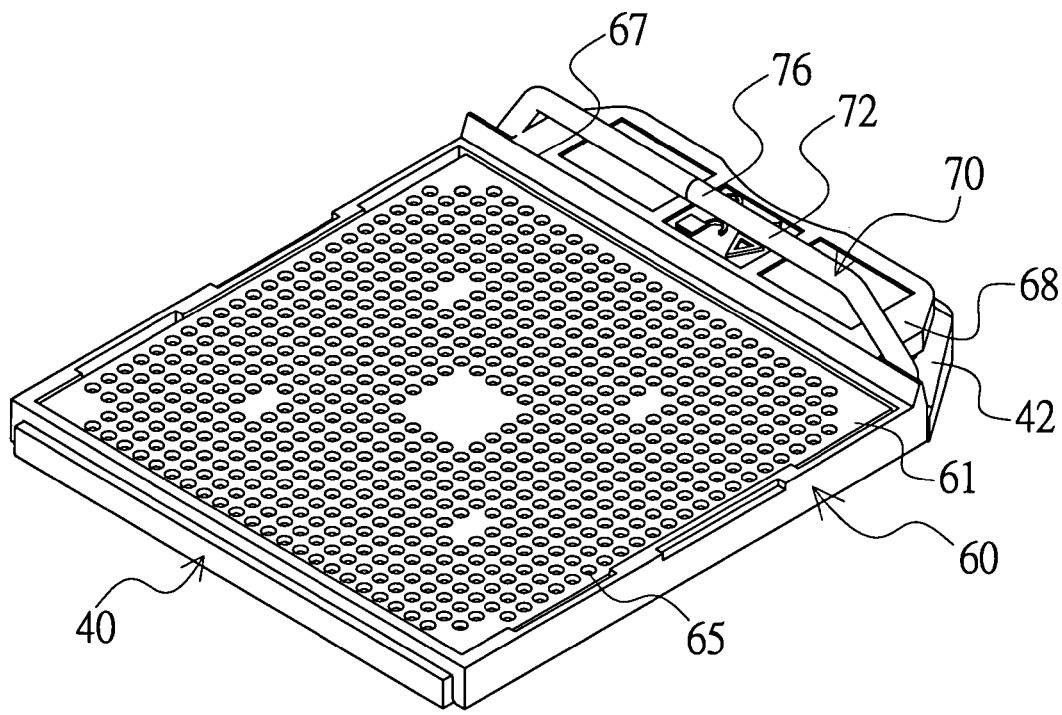
FIG. 7 is a pictorially assembled view showing the electrical connector according to the first embodiment of the invention.
Figure 8:
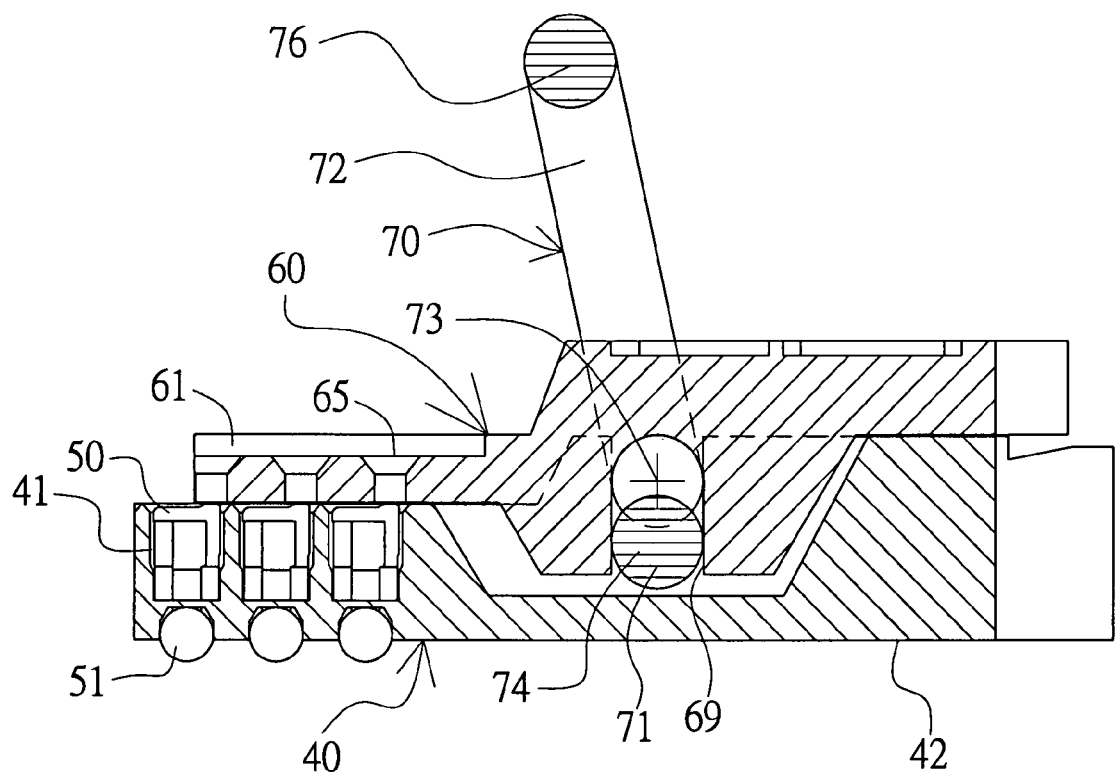
FIG. 8 is an assembled side view showing the electrical connector according to the first embodiment of the invention.

Referring to FIGS. 6 to 8, an electrical connector according to the first embodiment of the invention includes a base 40, several terminals 50, a plastic upper cover 60 and a lever 70.

The base 40 is made of a plastic material by way of injection molding and is formed with terminal slots 41 arranged in an array and a supporting seat 42 disposed behind the terminal slots 41. The supporting seat 42 has two sides each formed with a pivoting portion 43 and a middle portion formed with a cavity 44. The pivoting portion 43 is close to the terminal slot 41 so that the front area of the pivoting portion of the supporting seat 42 is about four times of the rear area of the pivoting portion of the supporting seat 42. In addition, two locking blocks 45 are disposed on two sides of the terminal slot region.

The terminals 50 are disposed in the terminal slots 41 of the base 40. Each terminal 50 has a top end formed with a wider guide-in port 52 and a narrower clamping mouth 53, and a bottom end connected to a solder ball 51. Because the terminal 50 is not the key point of the invention, the detailed structure thereof will be omitted.

The upper cover 60 is made of a plastic material by way of injection molding, covers the base 40 and is engaged with the base 40. The upper cover 60 has a main body 61 and a rear plate 68. The main body 61 has two lateral sides 66 and front and rear ends 62 and 63, and the front view of the main body has an inverse-U shape. Slots 64 to be engaged with the locking blocks 45 of the base 40 are formed on two sides of the main body. The main body is formed with through holes 65 corresponding to the terminal slots 41 of the base 40. A rear end 63 of the main body is formed with an upward flange 67. The rear plate 68 is disposed on the rear end 63 of the main body 61 and the middle of the inner surface is formed with a slot 69. After the upper cover 60 covers and is engaged with the base 40, the rear end 63 thereof is close to the pivoting portion 43 of the base 40.

The lever 70 is formed by bending a metal wire and has a rocking portion 72 and a pivoting shaft 71. Two sides of the pivoting shaft 71 are formed with first shafts 73 and the middle of the pivoting shaft 71 is formed with a downward second shaft 74, wherein the first shafts 73 and the second shaft 74 are eccentric shafts. The first shaft 73 is pivotally connected to the pivoting portion 43 of the base 40. The second shaft 74 is engaged with the slot 69 on the inner surface of the rear plate of the upper cover 60. The rocking portion 72 has a substantially inverse-U shape and has two side portions 75 and a handle 76 disposed between the side portions 75. The side portions 75 are respectively connected to the first shafts 73 at two sides with an angle of about 70 degrees formed between the side portion 75 and the first shaft 73. In addition, the middle of the handle 76 is a connection portion 77 of the metal wire. When the rocking portion 72 is rocked to make the pivoting shaft 71 rotate, the upper cover 60 is moved back and forth. The two side edges of the rocking portion 72 of the lever 70 do not exceed the two side edges of the rear plate 68 of the upper cover 60 and do not exceed the side edges of the main body 61 of the upper cover 60. The extending lengths of the two side portions 75 do not exceed the outer edge of the supporting seat 42 of the base. In other words, the side edge of the rear plate 68 of the upper cover 60 is nearer to a middle of the upper cover 60 than a side edge of the main body 61, and the rocking portion 72 of the lever 70 is disposed between the side edge of the rear plate 68 of the upper cover 60 and the side edge of the main body 61 of the upper cover 60 so that the rocking portion 72 of the lever 70 may be rotated with respect to the side edge of the rear plate 68 without exceeding the side edge of the main body 61. In addition, the rear end of the main body is formed with the upward flange 67 so that the rocking portion 72 of the lever 70 only can be rotated backward without exceeding the outer edge of the supporting seat 42.

Figure 9:
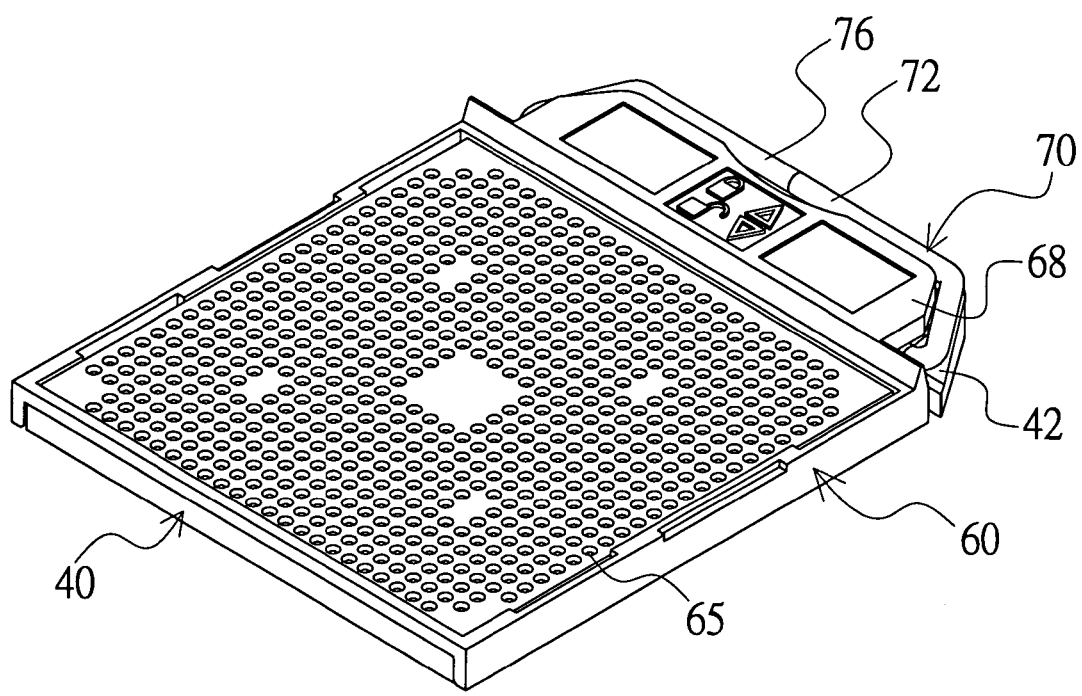
FIG. 9 is a pictorial view showing a used state according to the first embodiment of the invention.
Figure 10:
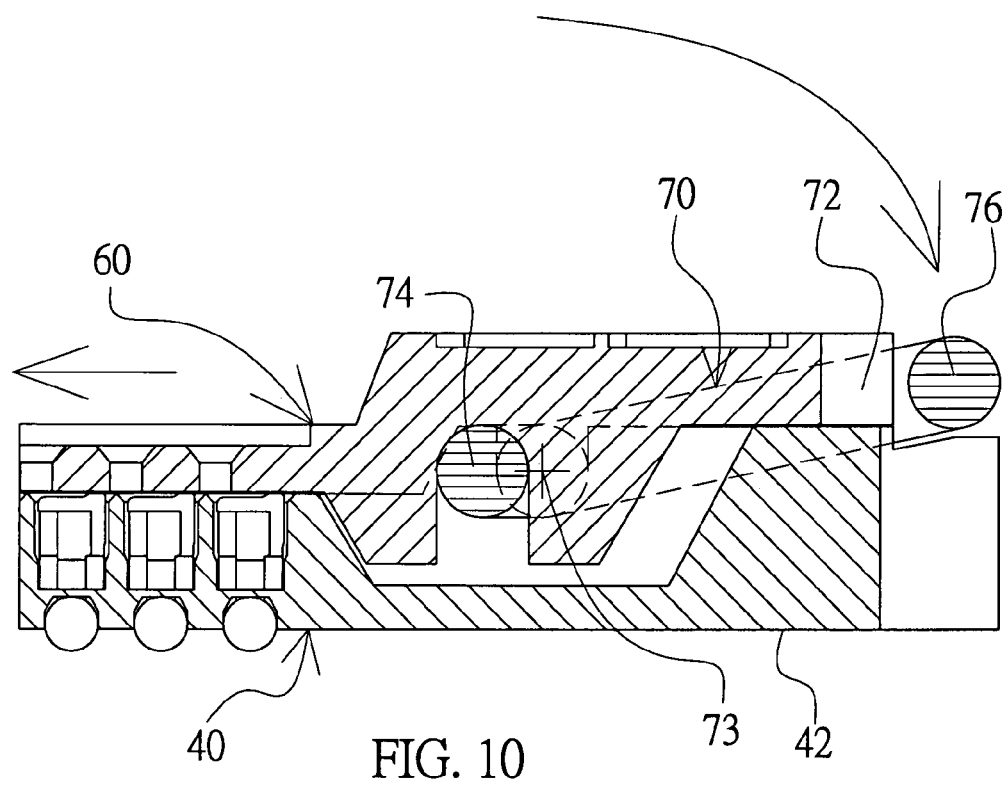
FIG. 10 is a side view showing the used state according to the first embodiment of the invention.

As shown in FIGS. 7 and 8, when the rocking portion 72 of the lever 70 is in an upright state, the pins of the CPU may be inserted into the through holes 65 of the upper cover 60 without interference. As shown in FIGS. 9 and 10, when the handle 76 of the rocking portion 72 is pressed downward and backward to make the pivoting shaft 71 rotate, the second shaft 74 of the pivoting shaft moves the upper cover 60 forward because the first shaft 73 is pivotally connected to the pivoting portion of the base 40 and cannot be moved back and forth. Thus, the pins of the CPU are elastically clamped by the terminals 50 and the electrical connections are formed. The structure of elastically clamping the pins of the CPU by the terminals is not the important feature and may have many variations well known in the art, so detailed descriptions thereof will be omitted.

The invention has the following advantages.

First, a lever mechanism capable of being rotated backward is disposed in the rear section region of the CPU connector so that the space on the lateral side cannot be occupied and the operation may be made conveniently.

Second, the rocking portion 72 of the lever 70 is configured to have the substantial inverse-U shape. The two ends of the rocking portion 72 are connected to the pivoting shaft 71 to apply the force to the pivoting shaft 71 so that the two side portions 75 can move with the pivoting shaft 71 effectively under the restricted arm of force.

Third, the pivoting portion 43 of the base 40 is close to the terminal slot 41 so that the rear area of the pivoting portion of the supporting seat 42 is about four times of the front area of the pivoting portion of the supporting seat 42. Consequently, the rocking portion 72 may have a longer arm of force when the lever 70 does not exceed the supporting seat 42.

Figure 11:
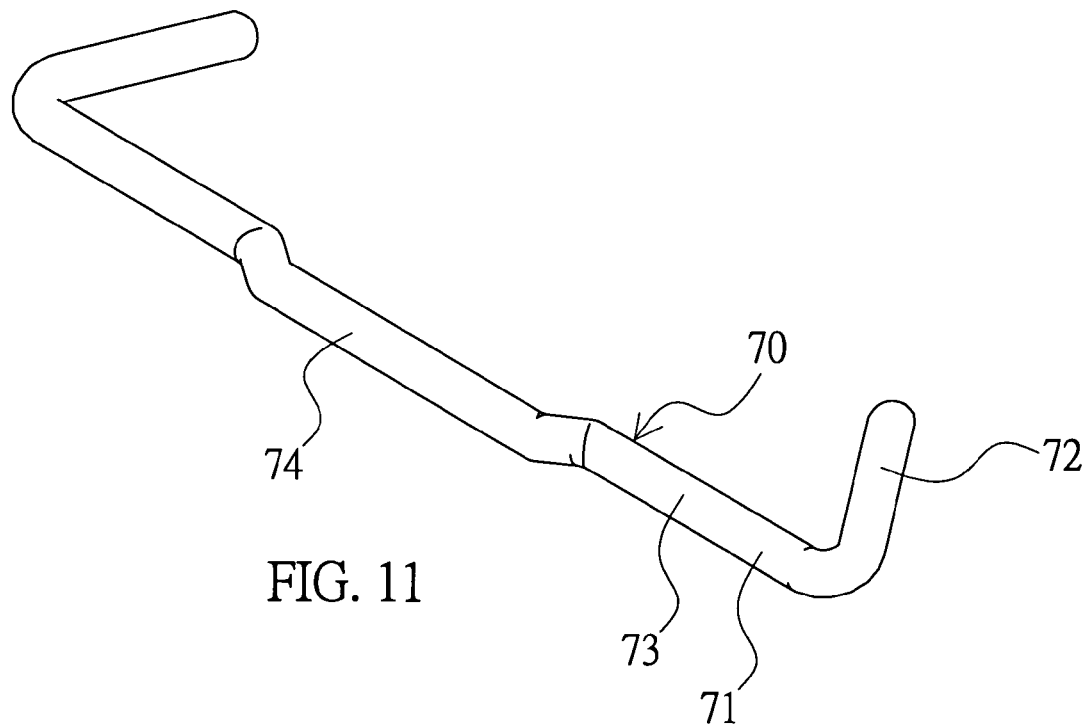
FIG. 11 is a pictorial view showing a lever according to a second embodiment of the invention.

As shown in FIG. 11, the second embodiment of the invention is different from the first embodiment in that the connection portion 77 of the lever 70 is disposed at the middle of the second shaft 74 of the pivoting shaft 71.

Figure 12:
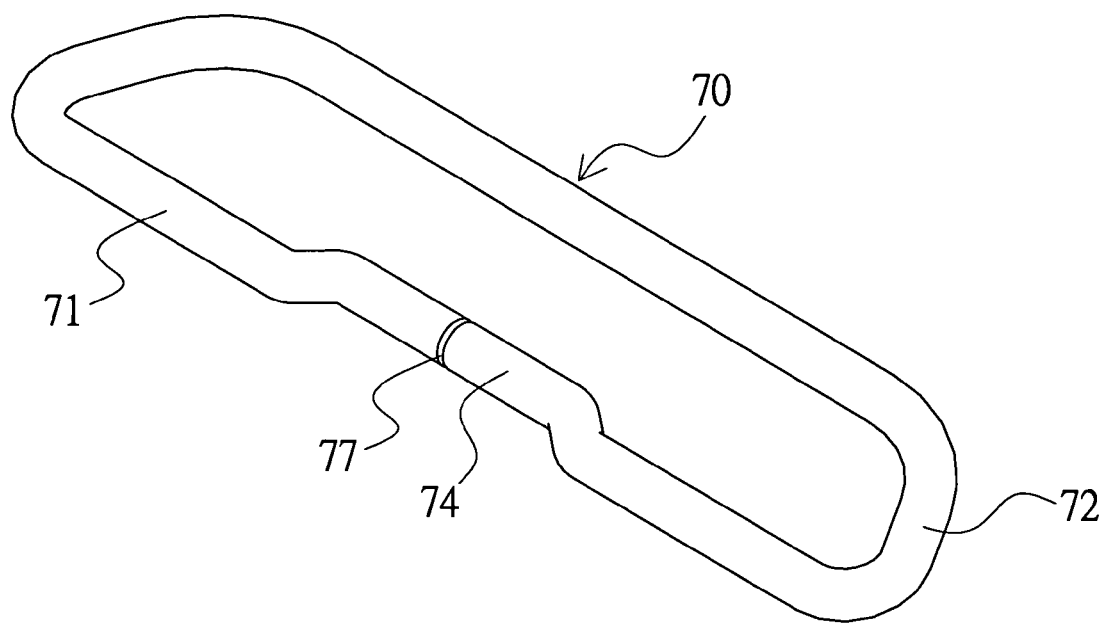
FIG. 12 is a pictorial view showing a lever according to a third embodiment of the invention.

As shown in FIG. 12, the third embodiment of the invention is almost the same as the first embodiment except that the rocking portion 72 of the lever 70 and the first shaft 73 form an angle of about 75 degrees.

Figure 13:
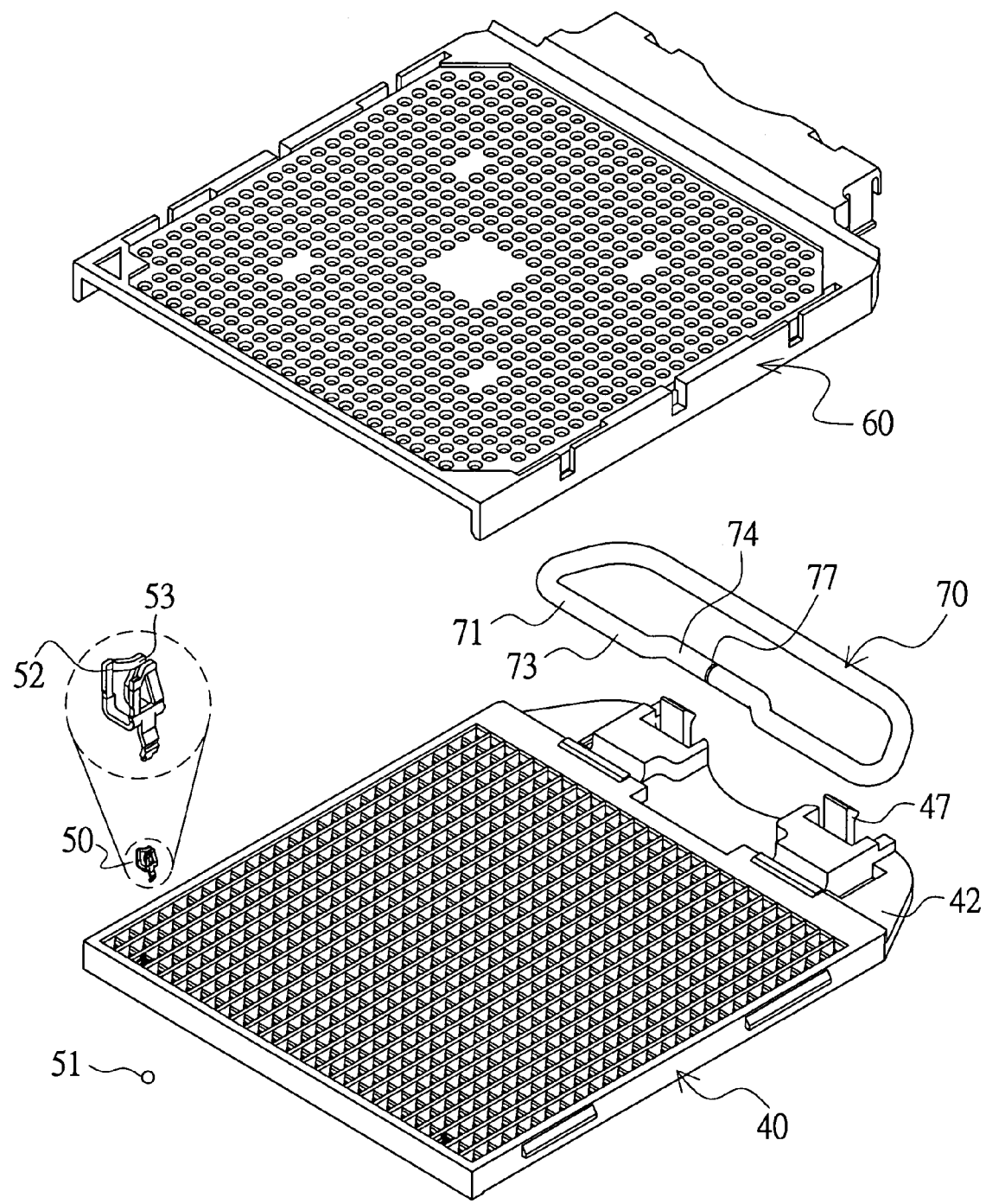
FIG. 13 is a pictorially exploded view showing an electrical connector according to a fourth embodiment of the invention.
Figure 14:
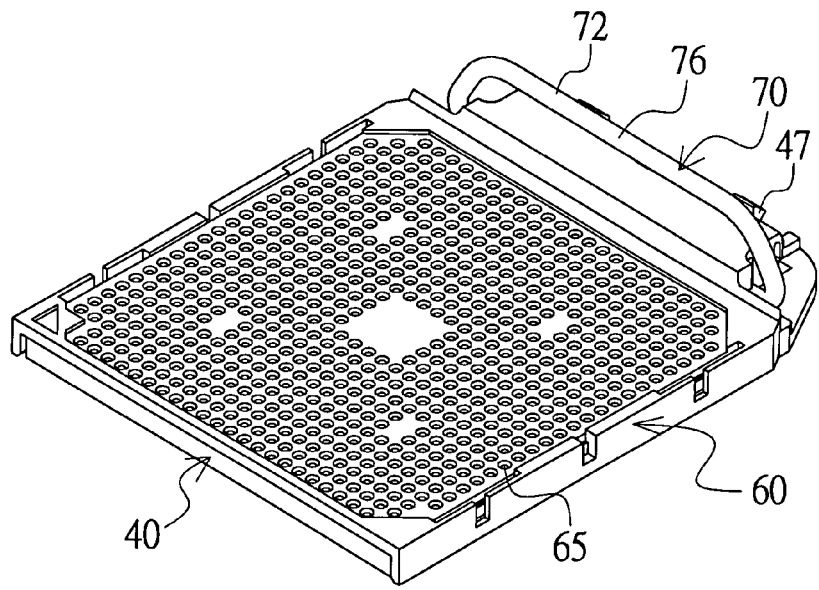
FIG. 14 is a pictorially assembled view showing the electrical connector according to the fourth embodiment of the invention.
Figure 15:
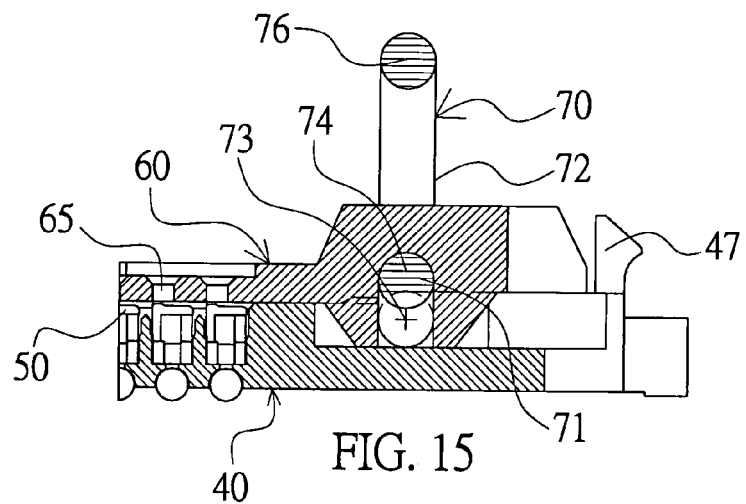
FIG. 15 is an assembled side view showing the electrical connector according to the fourth embodiment of the invention.

As shown in FIGS. 13 to 15, the fourth embodiment of the invention is almost the same as the first embodiment and similarly includes a base 40, several terminals 50, a plastic upper cover 60 and a lever 70. The difference between the fourth and first embodiments is that the second shaft 74 of the pivoting shaft 71 of the lever 70 is eccentric upwards with respect to the first shaft 73, and the connection portion 77 is disposed on the second shaft 74. In addition, the rear end of the supporting seat 42 has two elastic hooks 47.

Figure 16:
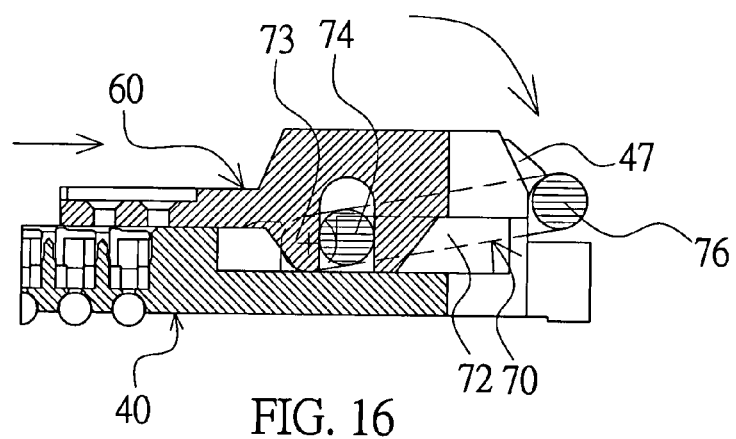
FIG. 16 is a side view showing a used state of the electrical connector according to the fourth embodiment of the invention.

According to the above-mentioned structures, as shown in FIGS. 14 and 15, the pins of the CPU may be inserted into the through holes 65 of the upper cover 60 without interference when the rocking portion 72 of the lever 70 is in the upright state. As shown in FIG. 16, the second shaft 74 of the pivoting shaft moves the upper cover 60 backward because the first shaft 73 is pivotally connected to the pivoting portion of the base 40 and cannot be moved back and forth when the handle 76 of the rocking portion 72 is pressed downward and backward to make the pivoting shaft 71 rotate. Thus, the pins of the CPU are elastically clamped by the terminals 50 and are thus electrically connected to the terminals 50. In this embodiment, the lever 70 moves the upper cover 60 in a direction opposite to that of the first embodiment. So, the terminals 50 have to be inserted reversely so that the guide-in port 53 faces a direction opposite to that of the first embodiment.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A central processing unit (CPU) connector, comprising:
    a base formed with terminal slots arranged in an array, and a supporting seat, which is disposed behind the terminal slots and formed with pivoting portions;
    an upper cover, which covers and is engaged with the base and may slide back and forth relative to the base, wherein the upper cover has a main body and a rear plate, the main body is formed with through holes, which are arranged in an array and correspond to the terminal slots of the base, and the rear plate is connected to a rear end of the main body;
    terminals disposed in the terminal slots of the base; and
    a lever having a rocking portion and a pivoting shaft, wherein the pivoting shaft comprises first shafts and a second shaft, the first shafts are eccentric with respect to the second shaft, the first shafts are pivotally connected to the pivoting portions of the base, the second shaft is engaged with an inner surface of the rear plate of the upper cover, the rocking portion is connected to the first shaft with an angle formed between the rocking portion and the first shaft, and the upper cover is moved back and forth when the rocking portion is rocked so that the pivoting shaft is rotated, wherein:
    a side edge of the rear plate of the upper cover is nearer to a middle of the upper cover than a side edge of the main body; and
    the rocking portion of the lever is disposed between the side edge of the rear plate of the upper cover and the side edge of the main body of the upper cover so that the rocking portion of the lever may be rotated with respect to the side edge of the rear plate without exceeding the side edge of the main body.

2. The connector according to claim 1, wherein the pivoting portion of the supporting seat of the base is close to the terminal slot so that a rear area of the pivoting portion of the supporting seat is larger than a front area of the pivoting portion of the supporting seat.

3. The connector according to claim 2, wherein the rear end of the main body of the upper cover is formed with an upward flange so that the rocking portion of the lever only can be rotated downward and backward from an upright state.

4. The connector according to claim 1, wherein the angle between the rocking portion of the lever and the first shaft is smaller than 90 degrees.

5. The connector according to claim 1, wherein the second shaft is connected to and disposed between the first shafts.

6. The connector according to claim 5, wherein two sides of the pivoting shaft of the lever are connected to the rocking portion.

7. The connector according to claim 6, wherein the rocking portion of the lever has a substantially inverse-U shape.

8. The connector according to claim 1, wherein the rocking portion of the lever does not exceed an outer edge of the supporting seat when the supporting seat is rotated by a maximum angle.

* * * * *